United States Patent [19]

Wine

[11] 4,385,204

[45] May 24, 1983

[54] SINGLE BUTTON CONTROL

[75] Inventor: Charles M. Wine, Princeton, N.J.

[73] Assignee: RCA Corporation, New York, N.Y.

[21] Appl. No.: 257,184

[22] Filed: Apr. 24, 1981

[51] Int. Cl.³ .............................................. H04N 5/60
[52] U.S. Cl. ............................. 179/1 VL; 340/168 B;
358/198; 455/232
[58] Field of Search ......... 179/1 VL; 358/198, 194.1;
455/177, 200, 232, 355; 340/168 B; 328/44

[56] References Cited

U.S. PATENT DOCUMENTS

Re. 30,054  7/1979  Ong .................................... 455/232
3,914,698  10/1975  Leuschner ........................ 328/44 X
4,229,765  10/1980  Sanger .
4,263,581   4/1981  Okatani et al. .................. 340/168 B

OTHER PUBLICATIONS

Stanley Model 2000/3000 Residential Garage Door Opener, on sale no later than Fall 1980, Overall Electrical Schematic 360-2305 with Associated Schematic 9366 dated 8-18-78 for Motor Control Board 360-2275 mfgd. by Multi-Elmac Co. and with Associated Schematic 9352 dated 11-22-77 for RCVR Board 1093 also mfgd. by Multi-Elmac Co.

Primary Examiner—G. Z. Rubinson
Assistant Examiner—Keith E. George
Attorney, Agent, or Firm—E. M. Whitacre; P. J. Rasmussen; P. M. Emanuel

[57] ABSTRACT

A volume control system includes means responsive to a single push button for reversing the direction of volume level change for each alternate depression of the push button. Specifically, for a first depression of the push button, the volume is continuously increased so long as the push button is held down. For a second depression of the push button, the volume is continuously decreased so long as the push button is held down. The disclosed system saves the cost of an additional push button while providing an easy-to-use system for volume level adjustment.

9 Claims, 1 Drawing Figure

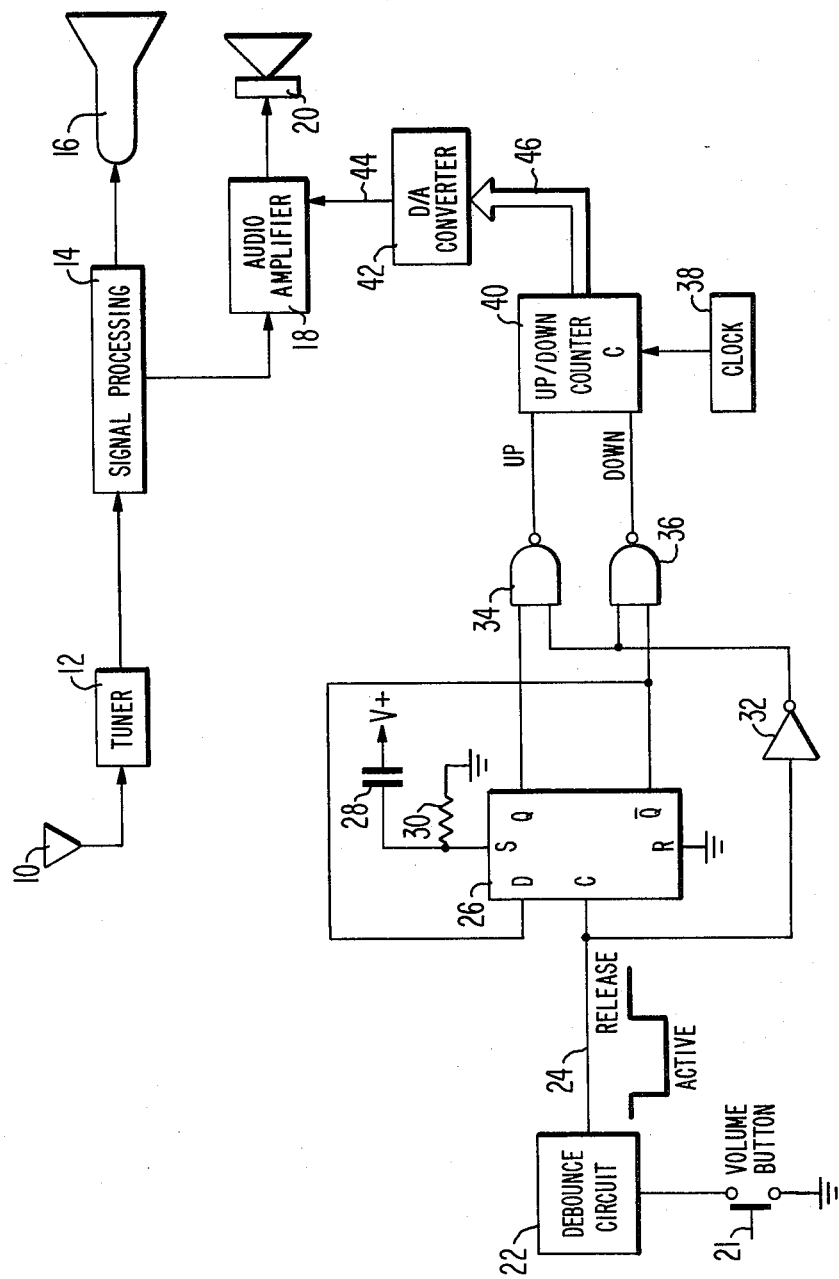

SINGLE BUTTON CONTROL

This invention relates to analog function controls, e.g., volume controls, as may be used in radio and television receivers.

Many receivers have push buttons for controlling the audio volume level of the received signal. A typical push button volume control system includes an UP button for increasing the volume, and a DOWN button for decreasing the volume. When the UP button is pressed, the audio level continues to increase so long as that button is held down. When the DOWN button is pressed, the audio level continues to decrease so long as that button is held down. When neither button is pressed, the audio volume remains at its previously set level.

The present invention may be employed in a volume control system wherein a single button is used for both increasing and decreasing the audio volume level. In accordance with the present invention, a control system is provided responsive to a first depression of a push button for continuously increasing the analog function, e.g., the audio volume level, so long as the push button is pressed, and responsive to a subsequent second depression of the push button for continuously decreasing the level so long as the push button is pressed. When the push button is released, the audio level remains at its previously set level.

The user thus presses the push button until the volume reaches the desired level. If the user overshoots the desired volume level, the button is simply released and pressed a second time. The level then decreases towards the desired level. Since, in conventional two button volume control systems, the audio volume level is often adjusted by depressing one button until the desired level is overshot and then depressing the other button to reverse direction to approach the desired level, when the present invention is used as single button volume control system, it provides the user with a natural and easy-to-use volume adjustment system.

Systems arranged in accordance with the present invention thereby require only one push button, e.g., for audio volume adjustment which reduces the cost of the control system. Alternately, a one-button volume control system, as compared to a two-button volume control system, makes available an additional push button which can be used for other television control functions.

The present invention will be described with reference to a sole FIGURE illustrating a television receiver including a single button audio volume control system arranged in accordance with the present invention.

As shown in the sole FIGURE, a television receiver includes an antenna 10 and a tuner 12 for selecting a desired television signal. A signal processing circuit 14 provides a video signal to a kinescope 16 and an audio signal to an audio amplifier 18. The amplified audio signal is applied to a speaker 20. The audio amplifier 18 includes an electronic gain control input connected to conductor 44. The gain of audio amplifier 18, and thereby the audio volume level is controlled by the level of voltage input applied on conductor 44.

The receiver includes a single button volume control system comprising a volume button 21 connected to a debounce circuit 22. Debounce circuits, which eliminate the effect of mechanical switch contact bounce, are well known in the art. When push button 21 is pressed, the output of the debounce circuit 22 on conductor 24 goes to logic "0". When push button 21 is released, the output of the debounce circuit on conductor 24 goes to logic "1".

The output of debounce circuit 22 is connected to the clock (C) input of data (D) type flip-flop (FF) 26 and the input of an inverter 32. The set (Q) and reset ($\bar{Q}$) outputs of FF 26 are connected to respective inputs of NAND gates 34 and 36. The $\bar{Q}$ output of FF 26 is connected to its data (D) input. The output of inverter 32 is connected to other inputs of NAND gates 34 and 36. An initialization circuit includes a capacitor 28 connected between a source of the supply voltage (V+) and the set (S) input of FF 26 and a resistor 30 connected between the S input and signal ground. The reset (R) input of FF 26 is connected to ground. The output of NAND gates 34 and 36 are connected to respective UP and DOWN inputs of an UP/DOWN counter 40. A periodic clock signal is provided to the clock (C) input of UP/DOWN counter 40 from clock source 38. The output of UP/DOWN counter 40 is connected via a digital data buss 46 to a digital to analog (D/A) converter 42. The analog output of D/A converter 42 on conductor 44 is connected to the electronic gain control input of audio amplifier 18.

In operation, when power is applied to the television receiver, initializing circuit 28, 30 couples a positive-going pulse to the S input of FF placing it in a set state in which the Q output of FF 26 is at logic "1" and the $\bar{Q}$ output is at logic "0".

When the volume button 21 is pressed, the signal on conductor 24 goes to a logic "0". At the same time, the output of inverter 32 goes to a logic "1", enabling NAND gates 34 and 36. Since Q is at logic "1", the output of NAND gate 34 is at logic "0", which causes the contents of UP/DOWN counter 40 to increase for each clock pulse from clock source 38. The digital output on data buss 46 thus increases, as does the analog output of D/A converter 42 on conductor 44, which in turn increases the gain of audio amplifier 18. The audio volume level thus increases so long as the volume button 21 is held down.

When volume button 21 is released, the signal on conductor 24 changes to a logic "1" which causes the output of inverter 32 to become a logic "0". NAND gates 34 and 36 are thus disabled. Since the output of NAND gates 34 and 36 are both at logic "1", UP/DOWN counter 40 holds its previous count. The digital output on data buss 46, and the analog output on conductor 44, maintain their previous value so that the previously set volume level is maintained.

Also, when volume button 21 is released, the transition of the signal on conductor 24 from logic "0" to a logic "1" causes FF 26 to transfer the logic level at its D input to its Q output. FF 26 may be realized using integrated circuit type CD4013 available from RCA Corporation. Since the Q output of FF 26 which at this point is at logic "0", is connected to its data input, FF 26 changes from a set state to a reset state. The Q output of FF 26 is then at logic "0" and the $\bar{Q}$ output is at logic "1".

When the volume button 21 is again pressed, the signal on conductor 24 again goes to a logic "0". At the same time, the output of inverter 32 goes to a logic "1" enabling NAND gates 34 and 36. Since FF 26 is now reset, the output of NAND gate 36 is at logic "0" which causes the contents of UP/DOWN counter 40 to decrease for each clock pulse from clock source 38. The digital output on data buss 46 thus decreases, as does the analog output of D/A converter 42 on conductor 44, which in turn decreases the gain of audio amplifier 18. The audio volume level thus decreases so long as the volume button 21 is held down.

When the volume button 21 is again released, the signal on conductor 24 again changes to a logic "1" which causes FF 26 to change to the opposite state, i.e., a set state. Also, the output of inverter 32 goes to logic "1" disabling NAND gates 34 and 36. UP/DOWN counter 40 thereby maintains its previous count so that the previously set volume level does not change.

In such manner, a volume control system in accordance with the present invention provides for volume level adjustment using a single push button. Volume may be conveniently adjusted by holding the push button down until the audio volume reaches the desired level. If the desired level is exceeded, then a second depression of the push button reverses the volume adjustment so as to approach the desired audio volume level.

As is known, circuits may be provided to turn the receiver on and off. For this purpose, as well as for maintaining the contents of UP/DOWN counter 40 when the receiver is off, it is desirable that the volume control circuitry be provided with standby power.

Although a mechanical push button has been described for use in conjunction with the present invention, it should be understood that other user activated switching elements may be used. For example, a capacitive switch that generates an output signal responsive to capacitance provided by the body of a user may be substituted for the mechanical push button 21. In such case, debounce circuit 22 may not be necessary.

The disclosed one button control system can also be used to control other analog functions besides audio volume level, e.g., brightness, color, etc.

While the present single button function control apparatus has been described as being located on the receiver for simplicity, it will be appreciated that it may as well, and perhaps desirably, be used in conjunction with a remote control system. In that case, the button itself would be located on the remote control unit and the logic, for example as shown in the FIGURE, would be included in the receiver. These and other modifications are intended to be within the scope of the present invention as defined by the appended claims.

Finally, the disclosed apparatus that is responsive to the push button 21 for increasing and decreasing the audio volume level is to be considered illustrative and not restrictive. For example, a programmed microprocessor may be used in lieu of the hardwired logic of the disclosed embodiment.

What is claimed is:

1. A control system comprising:
 a user activated switching element selectively having an activated state when activated by a user and a released state when not activated by a user, said switching element automatically returning to said released state when no longer activated by a user; and
 control means responsive to said activated state of said switching element when said switching element is activated a first time in a sequence of activations for continuously increasing a control function so long as said switching element is activated, and responsive to the same said activated state of said switching element when said switch element is activated a second time in said sequence for continuously decreasing said control function so long as said switching element is activated.

2. A control system in accordance with claim 1 wherein said control function is audio volume level.

3. A control system in accordance with claim 2 wherein said control means comprises:
 audio amplifier control means having first and second input control terminals for respectively increasing and decreasing said volume level, wherein a first level of binary signal on said first input control terminal continuously increases said volume level, and wherein said first level of binary signal on said second input control terminal continuously decreases said volume level; and
 sequential control means connected to said audio amplifier control means and responsive to said activated state of said switching element when said switching element is depressed a first time in said sequence for providing said first level of binary signal to said first input control terminal so long as said switching element is activated, and responsive to the same said activated state of said switching element when said switching element is activated a second time in said sequence for providing said first level of binary signal to said second input control terminal so long as said switching element is activated.

4. A control system in accordance with claim 3 further comprising:
 initialization circuit means for conditioning said sequential control means so that the initial activation of said switching element after power is initially applied to said sequential control means provides said first level of binary signal to said first input control terminal of said audio amplifier control means.

5. A control system according to claim 3 wherein said sequential control means comprises:
 a flip-flop having a clock terminal, a data input terminal, a data output terminal, and a complemented data output terminal, said flip-flop including:
 means for conditioning said flip-flop to change states for each cycle of signal applied to its clock terminal;
 first and second NAND gates having respective first and second input terminals and a respective output terminal, said output terminals of said first and second NAND gates being connected to respective first and second input control terminals of said audio amplifier control means, said first input terminal of said first NAND gate being connected to said data output terminal, said first input terminal of said second NAND gate being connected to said complemented data output terminal of said flip-flop;
 means for connecting said clock terminal of said flip-flop to said switching element; and
 an inverter having input and output terminals, the input terminal thereof being connected to said clock terminal of said flip-flop, the output terminal thereof being connected to said second input terminals of said first and second NAND gates.

6. A control system according to claim 1 or 2 or 3 or 4 or 5 wherein said switching element is a mechanical pushbutton switch having first and second contacts and a moveable element for selectively connecting said contacts so that said pushbutton switch has either a non-conducting or a conducting state, said pushbutton switch having one of said non-conducting or conducting states when said moveable element is depressed by a user and automatically returning to the other one of said non-conducting or conducting states when said moveable element is released, said one non-conducting or conducting states being said activated state of said switching element and said other one of said non-conducting or conducting states being said released state of said switching element.

7. A control system comprising:
a user activated switching element selectively having an activated state when activated by a user and a released state when not activated by a user, said switching element automatically returning to said released state when no longer activated by a user;
function control means having first and second input control terminals for generating a control signal and for selectively increasing and decreasing said control signal, wherein a first level of binary signal on said first input control terminal causes said control signal to continuously increase, and wherein said first level of binary signal on said second input control terminal causes said control signal to continuously decrease;
a flip-flop having a clock terminal, a data input terminal, a data output terminal, and a complemented data output terminal;
means for conditioning said flip-flop to change states whenever a clock signal is applied to its clock terminal;
first and second coincidence gates having respective first and second input terminals and a respective output terminal, said output terminals of said first and second coincidence gates being connected to respective first and second input control terminals of said function control means, said first input terminal of said first gate being connected to said data output terminal, said first input terminal of said second coincidence gate being connected to said complemented data output terminal of said flip-flop;
means for connecting said clock terminal of said flip-flop to said switching element so that clock signal is applied to said clock terminal when said switch element has said activated state; and
means for connecting said clock terminal of said flip-flop to said second input terminals of said first and second coincidence gates.

8. A control system in accordance with claim 7 further comprising:
initialization circuit means for conditioning said flip-flop so that the initial activation of said switching element after power is initially applied to said flip-flop causes said first level of binary signal to be coupled to said first input control terminal of said function control means.

9. A control system according to claim 8 wherein wherein said switching element is a mechanical pushbutton switch having first and second contacts and a moveable element for selectively connecting said contacts so that said pushbutton switch has either a non-conducting or a conducting state, said pushbutton switch having one of said non-conducting or conducting states when said moveable element is depressed by a user and automatically returning to the other one of said non-conducting or conducting states when said moveable element is released, said one non-conducting or conducting states being said activated state of said switching element and said other one of said non-conducting or conducting states being said released state of said switching element.

* * * * *